United States Patent
Kashima et al.

(10) Patent No.: US 7,505,502 B2
(45) Date of Patent: Mar. 17, 2009

(54) SEMICONDUCTOR LASER DEVICE AND MANUFACTURING METHOD THEREOF

(75) Inventors: Takayuki Kashima, Okayama-ken (JP); Kouji Makita, Hyogo-ken (JP); Kenji Yoshikawa, Okayama-ken (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/390,426

(22) Filed: Mar. 28, 2006

(65) Prior Publication Data

US 2007/0237199 A1    Oct. 11, 2007

(51) Int. Cl.
    *H01S 5/00*    (2006.01)
(52) U.S. Cl. ............... 372/50.121; 372/50.1; 372/43.01
(58) Field of Classification Search ............ 372/50.121, 372/50.1, 43.01
    See application file for complete search history.

(56) References Cited

U.S. PATENT DOCUMENTS

| | | | |
|---|---|---|---|
| 6,470,039 B1 * | 10/2002 | Ukita | 372/46.01 |
| 6,618,420 B1 * | 9/2003 | Gen-Ei et al. | 372/50.1 |
| 6,919,217 B2 | 7/2005 | Miyazaki et al. | |
| 7,016,385 B2 * | 3/2006 | Watanabe | 372/44.01 |
| 7,193,358 B2 * | 3/2007 | Yamada et al. | 313/502 |
| 2005/0069004 A1 * | 3/2005 | Watanabe et al. | 372/49 |
| 2007/0058687 A1 * | 3/2007 | Matsuki et al. | 372/50.121 |

FOREIGN PATENT DOCUMENTS

| | | |
|---|---|---|
| JP | 63-16693 | 1/1988 |
| JP | 11-186651 | 7/1999 |
| JP | 2001-210907 | 8/2001 |
| JP | 2001-345514 | 12/2001 |
| JP | 2002-26447 | 1/2002 |
| JP | 2003-309329 | 10/2003 |

* cited by examiner

*Primary Examiner*—Minsun Harvey
*Assistant Examiner*—Kinam Park
(74) *Attorney, Agent, or Firm*—McDermott Will & Emery LLP

(57) ABSTRACT

In a monolithic dual-laser semiconductor laser device capable of high power output, a window structure for each of laser elements is formed through a common step, thereby improving the device reliability. The semiconductor laser device has an infrared laser element li0 and a red laser element 120 monolithically integrated on an n-type semiconductor substrate i01. Each of the infrared and red laser elements 110 and 120 has a ridged waveguide and a window structure formed by Zn diffusion at each resonator facet. The infrared and red laser elements ii0 and 120 include p-type contact layers 109 and 119 on the ridges of the respective waveguides. The p-type contact layer 109 is thinner than the p-type contact layer 119.

12 Claims, 7 Drawing Sheets

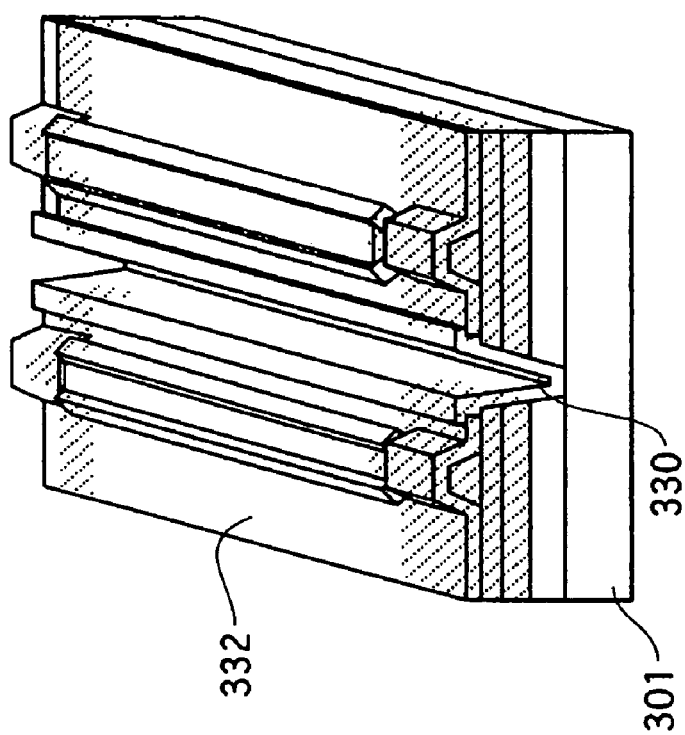
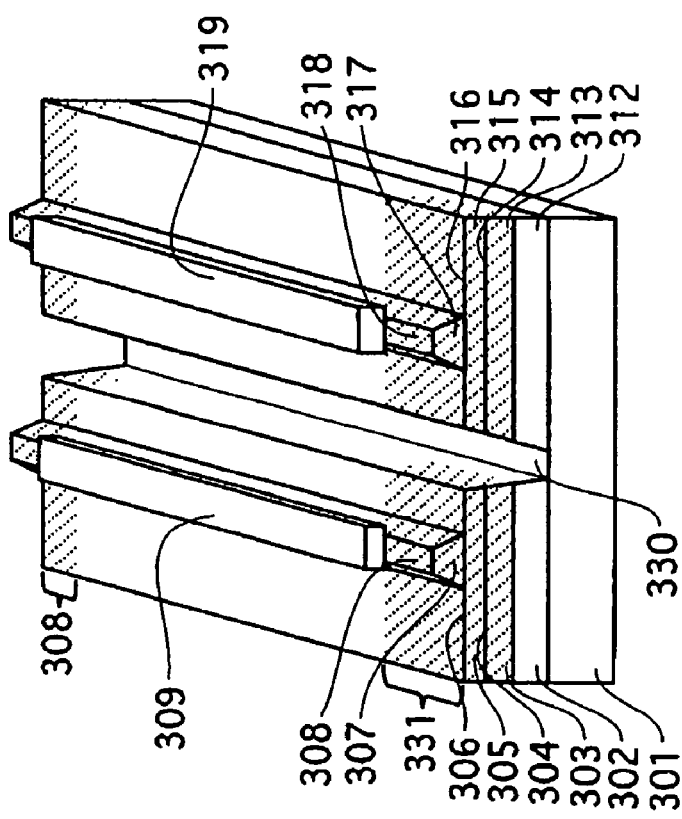
FIG.5A
FIG.5B

SEMICONDUCTOR LASER DEVICE AND MANUFACTURING METHOD THEREOF

This application is based on an application No. 2004-283887 filed in Japan, the contents of which are hereby incorporated by reference.

BACKGROUND OF THE INVENTION (1) Field of the Invention

The present invention relates to a semiconductor laser device and a manufacturing method thereof. More particularly, the present invention relates to a monolithic dual-wavelength semiconductor laser device having two semiconductor lasers of mutually different oscillation wavelengths, and to a manufacturing method thereof.

(2) Description of the Related Art

In recent years, large capacity DVD drives for recording and playback of optical information are rapidly becoming common in various fields, most notably in the field of video players. It is strongly desired that DVD drives be capable of reading conventional recording media, such as CDs, CD-Rs, and CD-RWs. To satisfy the demand, a DVD drive has two light sources for an optical pickup to record and play back DVDs and CDs. The one used for DVDs is a red semiconductor laser that emits light at wavelengths around 650 nm. The one used for CDs is an infrared semiconductor laser that emits light at wavelengths around 780 nm.

With the trend toward smaller information processing devices such as PCs, recording/playback devices for DVDs and other recording media are also required to be more compact and slim. To this end, it is essential to make optical pickups smaller and thinner. An optical pickup may be made smaller and thinner by reducing the number of optical components to simplify the structure. One scheme which helps to reduce the number of optical components is to integrate a red semiconductor laser and an infrared semiconductor laser into a single piece.

As one conventionally known example, JP Patent Application Publication No. 11-186651 (hereinafter, "patent literature 1") suggests a monolithic semiconductor laser device having red and infrared semiconductor lasers integrated on a single semiconductor substrate. In addition to the advantage that the two semiconductor lasers are integrated into a single piece, the disclosed construction allows such optical components as a collimator lens and a beam splitter to be shared between the red and infrared semiconductor lasers. Thus, the disclosed construction helps to reduce the device size and thickness.

Regarding such a monolithic semiconductor laser device, it is desired to improve the light output while ensuring stability and reliability of the device at high output power operation. For this purpose, more and more devices have started to employ a real refractive index guide structure and a window structure formed at a laser facet. In the window structure, the bandgap near the laser facet is larger than the bandgap of laser beam emission. In order to improve laser output, a greater amount of current needs to be supplied. With the increase in supply current, the vicinity of laser facet is subjected to heat generated through nonradiative recombination resulting from the interface state existing between the facet coat film and the laser facet. Because of the heat, the laser is more prone to deterioration. By employing the laser facet window structure, however, laser deterioration by heat is suppressed.

Since both the infrared and red lasers are expected to be operated at high power, both the lasers need to have facet window structures.

Some manufacturing methods known in the art are disclosed in, for example, JP patent application publication Nos. 2001-210907, 2002-026447, and 2001-345514 (hereinafter, referred to as the "patent literatures 2, 3, and 4" in the stated order).

FIG. 7 illustrate the manufacturing method of a red laser device having facet window structures, which is disclosed in the patent literature 2.

As shown in FIG. 7A, the following layers are epitaxially grown on an n-type semiconductor substrate 401 made of GaAs in the stated order: an n-type buffer layer 402 made of GaAs; an n-type cladding layer 403 made of AlGaInP; an active layer (a multiple quantum well structure with the oscillation wavelength of 660 nm) 404; a p-type first cladding layer 405 made of AlGaInP; an etching stop layer 406 made of GaInP; a p-type second cladding layer 407 made of AlGaInP; a p-type intermediate layer 408 made of GaInP; and a p-type contact layer 409 made of GaAs.

Next, with the use of a film forming device such as a sputtering device, ZnO is deposited on the entire wafer surface to form a ZnO film 410 (not illustrated). The ZnO film 410 is then patterned using photoresist, so as to leave the ZnO film only in the vicinities of later-formed laser facets (the remaining regions of the ZnO film are denoted by the reference numeral 410a).

Next, an insulating film 411 is deposited on the entire wafer surface. Through a thermal treatment, Zn diffuses from each ZnO film 410a into the laminated semiconductor layers. The thermal treatment is conducted with temperatures and time appropriate for Zn to reach the active layer (FIG. 7B).

In a region into which Zn has been diffused, the active layer 404 undergoes structural disorder. As a result, a window structure 412 having a larger bandgap than that of the active layer 404 is formed. Finally, each ZnO film 410a is removed (FIG. 7C).

As is generally known, GaAs materials are smaller in Zn diffusion coefficient than AlGaInP materials. With the use of this property, the GaAs contact layer 409 acts as a Zn diffusion controlling layer in the Zn diffusion process, so that a window structure is stably formed at each facet. In addition, excessive Zn diffusion in the window structure 412 is suppressed. This is advantages in a subsequent step of processing the p-type second cladding layer 407 into a striped pattern, because crumbling of the GaInP etching stop layer 406 existing below the p-type second cladding layer 406 is prevented. Consequently, the stripped pattern conforming in shape to the laser gain regions can be formed.

However, as stated above, the Zn diffusion coefficient of GaAs materials is rather small. Since the infrared laser has a GaAs-based active layer, it is more difficult to form a window structure than in a red laser having an AlGaInP-based active layer. This limitation may be addressed by separately subjecting the infrared and red lasers to different thermal treatments to achieve the substantially equal levels of Zn diffusion. Yet, by separately performing thermal treatments, a laser treated first for window structure formation is subjected to unnecessary heat at the time of conducting a thermal treatment for the other laser. The excessive heat induces occurrence of defects in the semiconductor. In addition, Zn excessively diffuses to reduce reliability of the active layer at the laser gain region.

Turning now to the patent literature 3, it is disclosed that AlGaAs instead of GaAs is used for a p-type contact layer to facilitate Zn diffusion. As a result, even in an infrared laser using a GaAs material, window structures are formed with good controllability and high reproducibility.

Turning now to the patent literature 4, it is disclosed that the active layers of the infrared and red lasers are individually optimized in thickness. The active layers each having an optimized thickness allows Zn to be suitably diffused by a single thermal treatment to from window structures in both the lasers.

SUMMARY OF THE INVENTION

Unfortunately, however, even with the techniques disclosed in the patent literatures 3 and 4, there still is the following setback relating to a monolithic dual-wavelength laser device having an infrared laser element and a red laser element integrated on a single substrate. That is, it is still difficult to form window structures for both the laser elements at the same time, while optimizing the performance of both the laser elements.

More specifically, according to the method disclosed in the patent literature 3, an AlGaAs contact layer needs to contain Al at a relatively high composition ratio in order to achieve Zn diffusion substantially equal to that in an AlGaInP material. Yet, with the increase of the Al content in AlGaAs, the resistivity increases. Consequently, the entire resistivity of the infrared laser element increases, which is disadvantageous in terms of high power output.

Yet, the method disclosed in the patent literature 4 also has the following setback. The optimum thickness of the active layer in terms of Zn diffusion may not be an optimum thickness in terms of the performance of the laser element. Thus, it is difficult to determine the active layer thickness that satisfies both the requirements for optimum Zn diffusion and optimum performance of the respective laser element.

It addition, in manufacturing a monolithic dual-wavelength laser device, the same material is used for cladding layers of both the red and infrared laser elements to reduce the number of manufacturing steps. Normally, the cladding layers are made of an AlGaInP material. In this case, the compositions of the respective cladding layers may be adjusted for optimum performance. As a result, the cladding layers of the red and infrared laser elements mutually differ in the Zn diffusion coefficients. The difference can not be accommodated only by chaining the thickness of the active layers.

The present invention relates to a manufacturing method of a monolithic dual-wavelength semiconductor laser device with a simple structure, and aims to allow the active layers of infrared and red laser elements to be disordered by thermally diffusing Zn all at once, while ensuring high reliability of the device.

In an attempt to meet the above aim, a monolithic semiconductor laser device includes a first semiconductor laser element and a second semiconductor laser element disposed on a single substrate. The first semiconductor laser element is operable to emit light at a first wavelength. The second semiconductor laser element is operable to emit light at a second wavelength. Each of the first and second semiconductor laser elements includes a double-hetero structure composed of a cladding layer of a first conductivity type, an active layer, a cladding layer of a second conductivity type, and a contact layer laminated in the stated order. The first and second semiconductor laser elements mutually differ in thickness of the respective contact layers.

With the above semiconductor laser device according to the present invention, the contact layers of the first and second laser elements differ from each other in film thickness. The difference in film thickness serves to suppress the tendency toward imbalance of impurity distribution between the first and second laser elements resulting from the difference in materials used in the respective laser devices. Consequently, the active and cladding layers of the two laser elements can be optimized at the same time.

More specifically, suppose that each of the two laser elements has a contact layer of the same thickness. In this case, in one of the laser elements having the contact layer made of a material allowing fewer impurities to be diffused, fewer impurities are diffused at the stage of forming window structures.

On the other hand, in the case where the contact layers of the first and second semiconductor laser elements differ from each other, fewer impurities are diffused in the laser element having a thicker contact layer at the stage of forming window structures.

That is, in the case where the active layer of the first laser element is made of a material having a smaller impurity diffusion coefficient than a material of the second laser element, the contact layer of the first laser element is made thinner than the contact layer of the second laser element. Consequently, the first and second laser elements undergo the same level of impurity diffusion by processing both the laser elements at once for forming window structures.

As has been described above, one of the first and second semiconductor laser elements made of a material allowing less impurity diffusion has a thinner contact layer than a contact layer of the other semiconductor laser element. With this arrangement, the two laser elements of uniform impurity diffusion are obtained by conducting a process of forming window structures. That is, since window structures can be formed for both the first and second semiconductor laser elements at the same time, the window structure forming step is required to be performed only once throughout the entire manufacturing process. Thus, the number of processing steps can be reduced and the manufacturing cost is consequently reduced. In addition, since neither of the semiconductor laser elements is required to redundantly undergo a thermal treatment step. Thus, excessive diffusion of impurities into the active layer due to such an excessive thermal treatment is prevented, which leads to improve the reliability of the semiconductor laser device.

The above semiconductor laser device of the present invention may more preferably have the following constructions.

Each of the first and second semiconductor laser elements may include a waveguide having a ridge. The first and second semiconductor laser elements may include a current blocking layer covering lateral surfaces of the ridge of each waveguide.

The first and second semiconductor laser elements may mutually differ in thickness of the respective contact layers at least by 0.01 μm. The contact layer of each of the first and second semiconductor laser elements may be at least 0.05 μm in thickness.

The first wavelength may be in an infrared waveband of 780 nm and the second wavelength may be in a red waveband of 660 nm.

The contact layer of each of the first and second semiconductor laser elements may be made of $Al_xGa_{1-x}As$, where $0 \leq x \leq 0.4$.

The contact layer of each of the first and second semiconductor laser elements may have a carrier density of $5 \times 10^{17}$ $cm^{-3}$ or higher.

The current blocking layer may cover of the upper surface of the ridge of each waveguide at least at a region corresponding to where a window structure is formed. Normally, current injection into a window structure region causes heat generation at each resonator facet. Yet, such heat generation is suppressed because the current blocking layer covers the upper surface of each window structure region.

The first and the second semiconductor laser elements may be separated by a separation groove of which inner surface is coated with an insulating film.

In an attempt to meet the above aim, another aspect of the present invention provides a manufacturing method of a semiconductor laser device. The method includes: a first laminate forming step of forming a first semiconductor laminate composed of a first cladding layer of a first conductivity type, a first active layer, a first cladding layer of a second conductivity type, and a first contact layer of the second conductivity type laminated on a semiconductor substrate in the stated order; a first laminate removing step of removing the first semiconductor laminate at a portion corresponding to a predetermined region of the substrate; a second laminate forming step of forming a second semiconductor laminate composed of a second cladding layer of the first conductivity type, a second active layer, a second cladding layer of the second conductivity type, a second contact layer of the second conductivity type laminated in the stated order on the predetermined region of the substrate, the second contact layer differing in thickness from the first contact layer; a second laminate removing step of removing the second laminate at a portion corresponding to a region other than the predetermined region of the substrate; and an electrode forming step of forming electrode pairs each on the respective semiconductor laminates to form semiconductor laser elements, each electrode pair being composed of an electrode formed on a rear surface of the substrate and an electrode formed on an upper surface of a ridge of a waveguide of the respective semiconductor laminate.

With the manufacturing method according to the present invention, the first contact layer of the second conductivity type again has a different film thickness from the second contact layer of the second conductivity type. Thus, for one of the semiconductor laser elements using a material allowing less impurity diffusion, the contact layer is made to be thinner than the contact layer of the other semiconductor laser element. With this arrangement, the two laser elements undergo substantially same levels of impurity diffusion at the time of window structure formation.

The above manufacturing method of the present invention may more preferably have the following constructions.

The manufacturing method may further include: an impurity applying step of applying a source of impurities to a predetermined region of surfaces of the first and second semiconductor laminates; and a window structure forming step of heat treating the substrate to diffuse the impurities into the first and second semiconductor laminates, thereby forming a window structure.

One selected from the group consisting of Zn and Si may be used as the impurities.

The manufacturing method may further include: a ridged-waveguide forming step of forming the two waveguides each having the ridge by patterning the first cladding layer of the second conductivity type and the first contact layer of the second conductivity type, and by patterning the second cladding layer of the second conductivity type and the second contact layer of the second conductivity type.

The manufacturing method may further include: a current blocking layer forming step of forming a current blocking layer covering lateral surfaces of the ridge of each of the two waveguides.

In the current blocking layer forming step, the current blocking layer may be formed to cover the upper surface of the ridge of each waveguide at a region corresponding to where a window structure is formed.

The manufacturing method may further include: a contact layer removing step of removing each of the first and second contact layers at a region corresponding to a vicinity of either or both facets of a resonator of the respective semiconductor laser element.

In the contact layer removing step, each of the first and second contact layers may be removed at the region that measures at least 5 μm from the respective resonator facet in a direction toward a laser gain region.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings:

FIGS. 5A and 5B are views illustrating steps of a manufacturing method of a semiconductor laser device according to an embodiment 2 of the present invention;

DESCRIPTION OF THE PREFERRED EMBODIMENT

The following describes embodiments of the present invention, with reference to the accompanying drawings.

Embodiment 1

Structure of Dual-Wavelength Semiconductor Laser Device

Figure 1A:
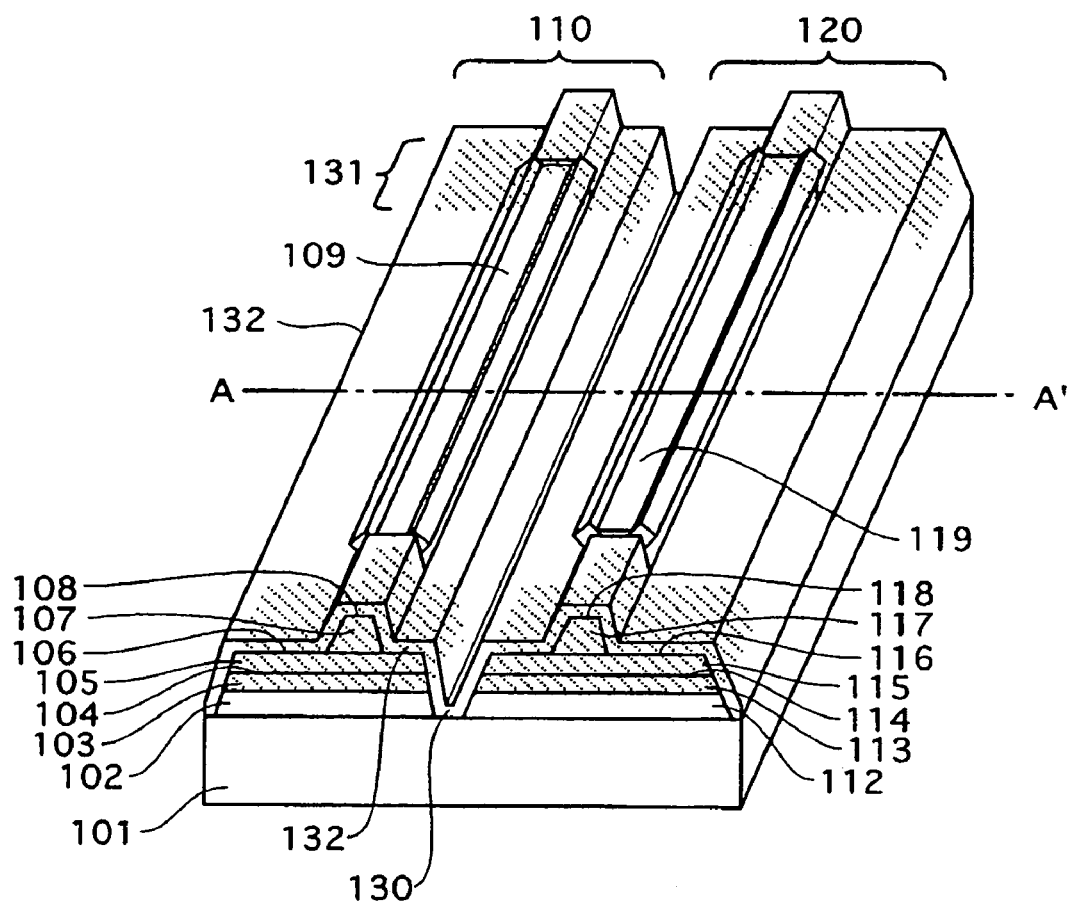
FIG. 1A is an oblique view and FIG. 1B is a sectional view of a semiconductor laser device according to an embodiment 1 of the present invention.
Figure 1B:
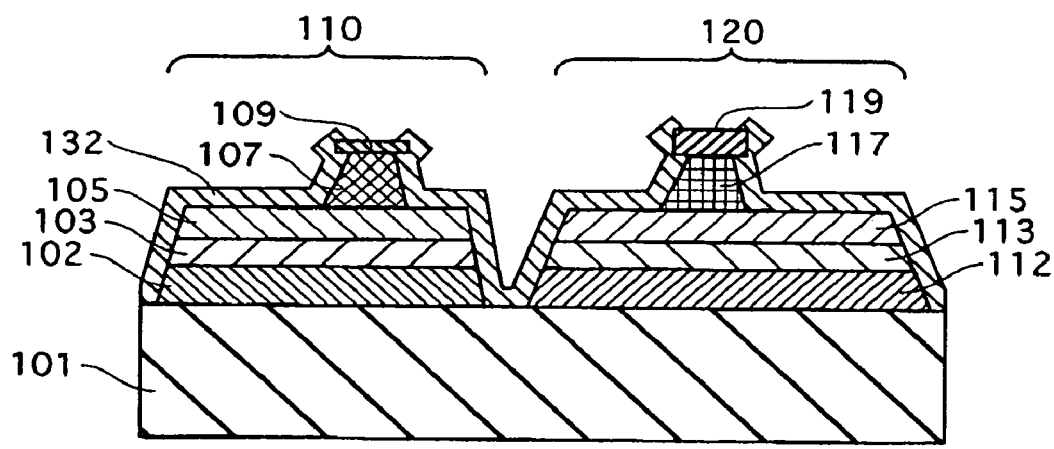

FIG. 1A is a schematic oblique view of a semiconductor laser device according to an embodiment 1 of the present invention. FIG. 1B is a sectional view taken along the line A-A' of FIG. 1A.

According to the embodiment, the monolithic dual-wavelength semiconductor laser device is composed of an n-type GaAs substrate 101, and an infrared laser element 110 and a red laser element 120 assembled on the substrate 101. Each laser element has the following construction.

The infrared laser element 110 has the following layers laminated on the n-type GaAs substrate 101 in the stated order: an n-type GaAs buffer layer 102; an n-type $(Al_xGa_{1-x})_yIn_{1-y}P$ cladding layer 103; a GaAs/AlGaAs-based active layer 104; a p-type $(Al_xGa_{1-x})_yIn_{1-y}P$ first cladding layer 105; a p-type GaInP etching stop layer 106; a p-type $(Al_xGa_{1-x})_yIn_{1-y}P$ second cladding layer 107 having a ridge shape; a p-type GaInP intermediate layer 108; and a p-type GaAs contact layer 109.

On the other hand, the red laser element 120 has the following layers laminated on the n-type GaAs substrate 101 in the stated order: an n-type GaAs buffer layer 112; an n-type $(Al_xGa_{1-x})_yIn_{1-y}P$ cladding layer 113; a GaInP/AlGaInP-based active layer 114; a P-type $(Al_xGa_{1-x})_yIn_{1-y}P$ first cladding layer 115; a p-type GaInP etching stop layer 116; a p-type $(Al_xGa_{1-x})_yIn_{1-y}P$ second cladding layer 117 having a ridge shape; a p-type GaInP intermediate layer 118; and a p-type GaAs contact layer 119.

In addition, a current blocking layer 132 is formed to cover the lateral surfaces of the ridge-shaped second cladding layers 107 and 117 as well as the upper surfaces of the etching stop layers 106 and 116. A window structure 131 is formed in each region in the vicinity of a facet of the respective laser elements.

Here, the GaAs contact layers 109 and 119 have been etched to remove regions thereof existing above the window structures 131.

The infrared laser element 110 and the red laser element 120 are electrically insulated by a separation groove 130 formed by etching to expose a region of the n-type substrate 101. The inner surfaces of the separation groove 130 are coated with an insulating film. The layers of the infrared and red laser elements 110 and 120 are formed by Metal-Organic Chemical Vapor Deposition (MOCVD).

A feature of the embodiment lies in that the p-type GaAs contact layer 109 of the infrared laser element 110 is thinner than the p-type GaAs contact layer 119 of the red laser element 120. More specifically, the contact layer 109 of the infrared laser element measures 0.1 µm in thickness, and the contact layer 119 of the red laser element measures 0.2 µm in thickness.

Another feature lies in that the GaAs contact layers 109 and 119 have been etched to remove regions thereof existing above the window structures 131. In the description below relating to a manufacturing method of the dual-wavelength semiconductor laser device, an explanation will be given to the effects of providing different thickness contact layers and of removal of the regions of the contact layers existing above the widow structures.

Manufacturing Method of Dual-Wavelength Semiconductor Laser Device

The following describes the manufacturing method of the dual-wavelength semiconductor laser device having the above-described construction. In the description, reference is made to FIGS. 2, 3 and 4 each of which is a sectional view illustrating steps of the manufacturing method.

Figure 2A:
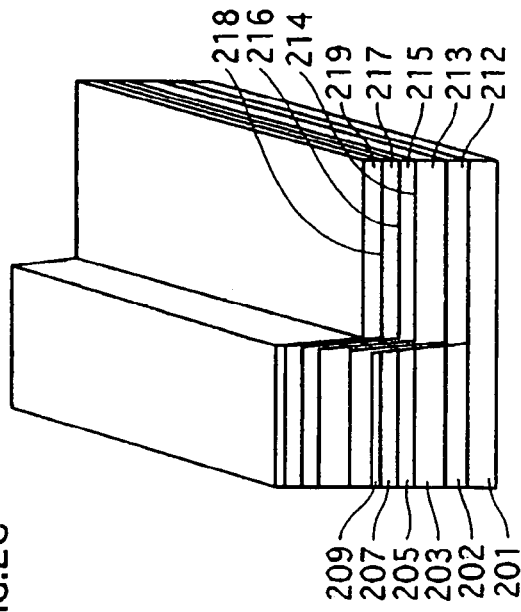
FIGS. 2A-2D are views illustrating steps of a manufacturing method of the semiconductor laser device according to the embodiment 1.

First, as illustrated in FIG. 2A, the following layers are sequentially formed using MOCVD on an n-type GaAs substrate 201: an n-type GaAs buffer layer 202; an n-type $(Al_xGa_{1-x})_yIn_{1-y}P$ cladding layer 203; a GaAs/AlGaAs-based active layer 204; a p-type $(Al_xGa_{1-x})_yIn_{1-y}P$ first cladding layer 205; a p-type GaInP etching stop layer 206; a p-type $(Al_xGa_{1-x})_yIn_{1-y}P$ second cladding layer 207; a p-type GaInP intermediate layer 208; and a p-type GaAs contact layer 209.

In the embodiment, each cladding layer is made of $(Al_xGa_{1-x})_yIn_{1-y}P$, where x=0.7 and y=0.5.

Figure 2C:
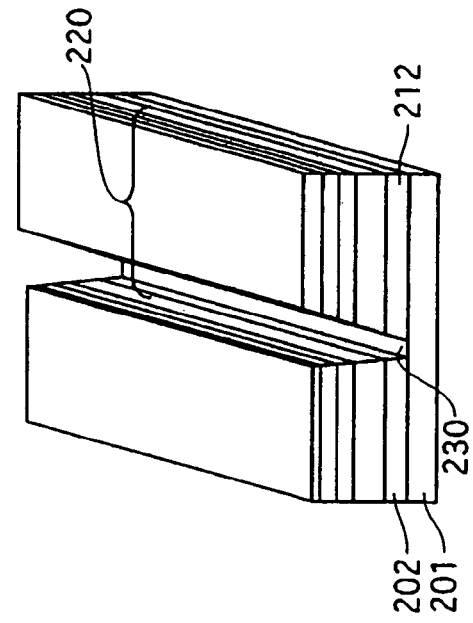
Figure 2B:
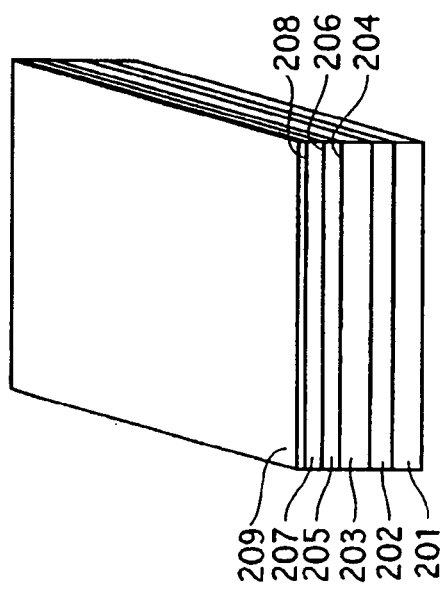

Next, as illustrated in FIG. 2B, a portion of the laminated body described above is removed using photolithography and wet etching techniques. Here, the removed portion corresponds to a region of the substrate on which the red laser element 120 is to be formed. That is to day, the laminated body remain unremoved at a portion corresponding to an infrared laser region 210.

The etching illustrated in FIG. 2B is performed to remove the corresponding portion of each layer up to the n-type GaAs buffer layer 202, so that the surface of the n-type GaAs substrate 201 is partly exposed. For accurately performing the selective etching, hydrochloric acid is used as the etchant to etch a semiconductor layer containing P and sulfuric acid is used as the etchant to etch a semiconductor layer containing As.

Next, as illustrated in FIG. 2C, the following layers are sequentially formed using MOCVD on a region of the substrate 201 including the exposed surface thereof: an n-type GaAs buffer layer 212; an n-type $(Al_xGa_{1-x})_yIn_{1-y}P$ cladding layer 213; a GaInP/AlGaInP-based active layer 214; a p-type $(Al_xGa_{1-x})_yIn_{1-y}P$ first cladding layer 215; a p-type GaInP etching stop layer 216; and a p-type $(Al_xGa_{1-x})_yIn_{1-y}P$ second cladding layer 217; a p-type GaInP intermediate layer 218; and a p-type GaAs contact layer 219.

In this embodiment, each cladding layer is made of $(Al_xGa_{1-x})_yIn_{1-y}P$ where x=0.7 and y=0.5.

As illustrated in FIG. 2C, as a result of this step, the above layers are also laminated on the infrared laser region 210.

Figure 2D:
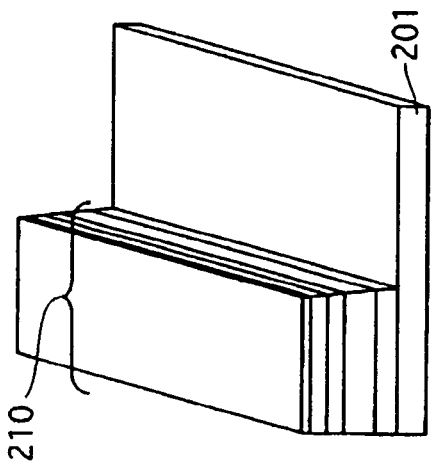

Next, as illustrated in FIG. 2D, the layers laminated for forming the red laser element are removed from the infrared laser region 210. As a result, the layers of the red laser element remain only in a red laser region 220. In addition, a separation groove 230 is formed using photolithography and wet etching techniques, so that the infrared laser element 110 and the red laser element 120 are separated.

Since each layer constituting the red laser element 120 is a semiconductor layer containing P, a hydrochloric acid is used as the etchant.

Note that in the steps of forming the contact layers, the p-type-GaAs contact layer 209 of the infrared laser element is thinner than the p-type GaAs contact layer 219 of the red laser element. Owing to the difference in thickness, uniform thermal diffusion of Zn is ensured in subsequent steps of forming facet window structures 231.

In addition, each contact layer is later subjected, prior to electrode formation, to a step of removing an oxide film from the surface of the contact layer or a step of etching the contact layer. In view of the above, it is desirable that each contact layer measures at least 0.05 µm in thickness at the time the layer is formed.

In the embodiment, the p-type GaAs contact layer 219 is formed to be 0.2 µm in thickness, whereas the p-type GaAs contact layer 209 is formed to be 0.1 µm in thickness.

Next, the facet window structures 231 are formed through the following steps.

Figure 3A:
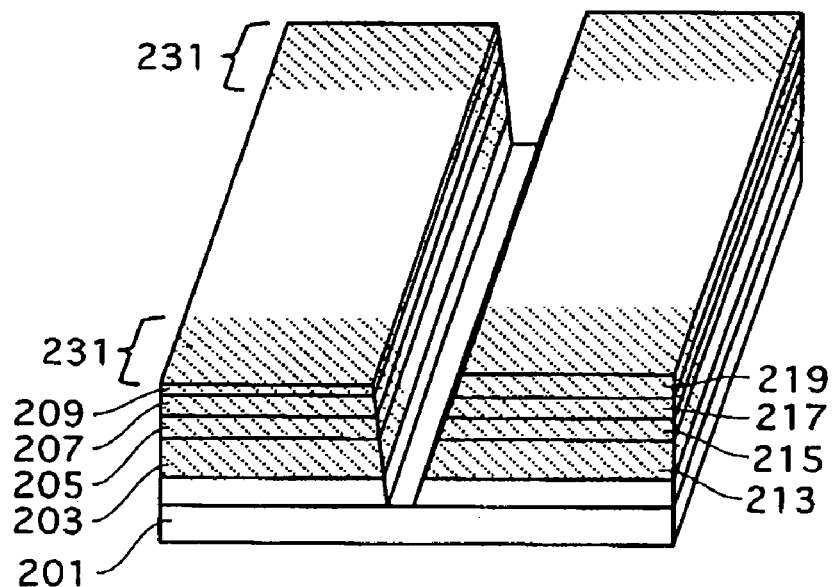
FIGS. 3A and 3B are views illustrating steps of the manufacturing method, continued from FIG. 2.

As illustrated in FIG. 3A, ZnO (not illustrated) is deposited by sputtering, over the entire surface of the n-type substrate 201. Then, the deposition of ZnO is patterned to leave Zno layers only in regions inwardly extending 20 µm or so from the laser cleavage surfaces (the regions 231 illustrated as diagonally shaded areas in the figure) In addition, an $SiO_2$ film (not illustrated) is deposited as a cap film over the entire surface of the substrate 201 including the ZnO layer surfaces.

Then, through a thermal treatment, Zn is thermally diffused into the semiconductor layers at regions thereof existing immediately below the ZnO layers. As a result, the ZnO diffused regions of the active layers are disordered and thus the window structures 231 are formed.

According to the method of the embodiment, the p-type GaAs contact layer 209 of the red laser element and the p-type GaAs contact layer 219 of the red laser element are formed to have mutually different thicknesses. By virtue of the thickness difference, the diffusion of impurities in the active and cladding layers of the two laser elements are optimized all at once. That is, it is prevented that Zn diffusion is not sufficient or excessive in the active and cladding layers of one or the other of the laser elements.

To give further explanation, the thickness of the p-type GaAs contact layer 209 of the infrared laser element differs from the thickness of the p-type GaAs contact layer 219 of the red laser element. Zn is thermally diffused under the same thermal condition from identical diffusion sources disposed on the respective contact layers. Naturally, the infrared and red laser elements exhibit different diffusion profiles through the respective contact layers. The contact layer of the infrared laser element, which is thinner, allows more Zn to be diffused therethough.

On the other hand, it should be noted that the active layer of the infrared laser element is a semiconductor layer containing As, whereas the active layer of the red laser element is a semiconductor layer containing P. Normally, a semiconductor layer containing As is smaller than a semiconductor layer containing P in thermal diffusion coefficient of Zn.

Taking the two factors into consideration, the red laser element has the active layer of which Zn thermal diffusion coefficient is smaller, and has the contact layer which is thinner to allow more Zn to be diffused. With this arrangement, the degrees of Zn diffusion are substantially balanced between the respective active layers of the two laser elements.

Figure 3B:
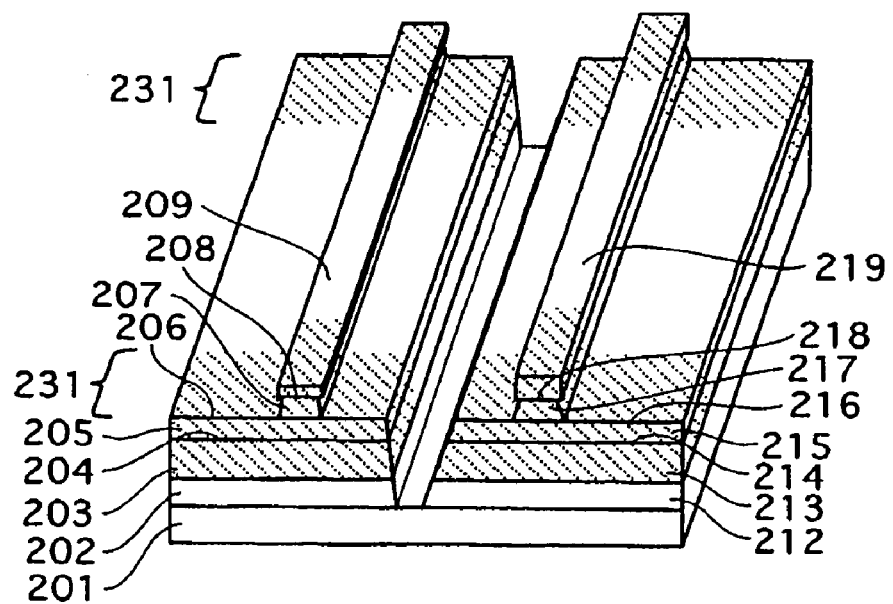

Next, an $SiO_2$ film (not illustrated) is formed on each of the infrared and red laser regions 210 and 220. The $SiO_2$ films are then processed into stripe mask patterns (not illustrated) using photolithography and wet etching techniques. With the use of the stripe mask patterns, the second cladding layer 207 of the infrared laser element and the second cladding layer 217 of the red laser element are etched as illustrated in FIG. 3B to a depth reaching the etching stop layers 206 and 216. As a result, each of the cladding layers 207 and 217 is shaped into a ridge.

The etching illustrated FIG. 3B is carried out through the combined use of wet and dry etching with inductively coupled plasma or reactive ion plasma.

Then, the mask patterns are removed using oxygen fluoride as the etchant. In addition, using photolithography and wet etching techniques, the p-type GaAs contact layers 209 and 219 are removed at regions thereof (not illustrated) each extending 25 μm beyond the respective window structures 231 toward the respective laser gain region. Here, sulfuric acid is used as the etchant to etch the contact layers.

Figure 4A:
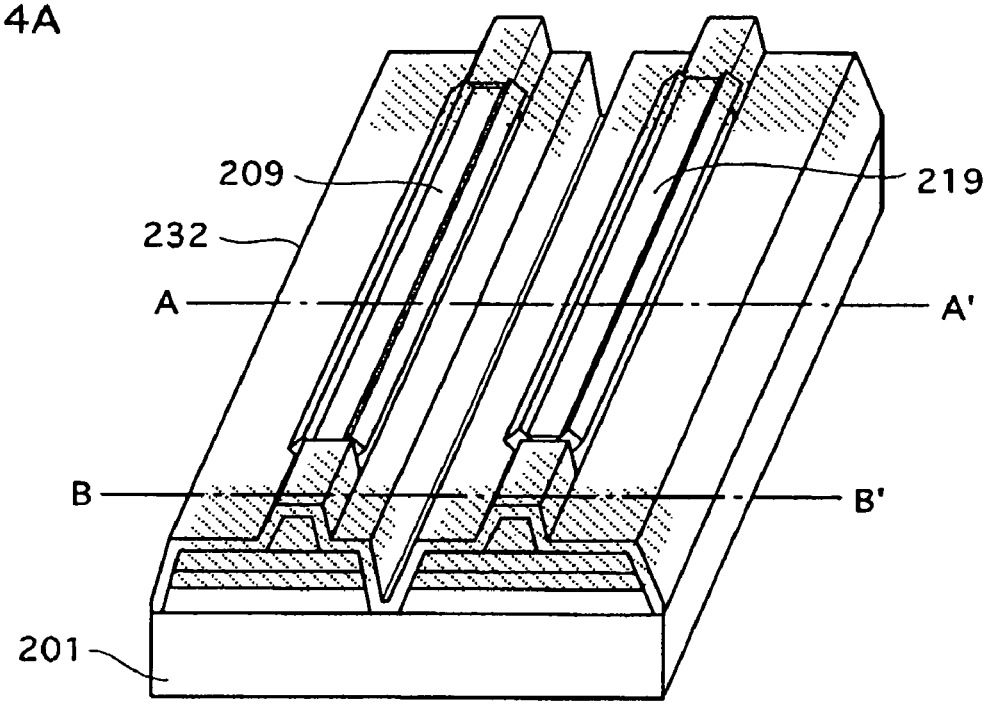
FIGS. 4A-4C are views illustrating steps of the manufacturing method, continued from FIG. 3.

Next, as illustrated in FIG. 4A, a current blocking layer 232 is formed by depositing an insulating film on the entire wafer surface. The insulating film is then partly removed using photolithography and wet etching techniques to expose the upper surface of each of the ridge-shaped cladding layers 207 and 217, except regions of the upper surfaces corresponding to Zn diffusion regions where the contact layers 209 and 219 have been removed by etching.

Figure 4B:
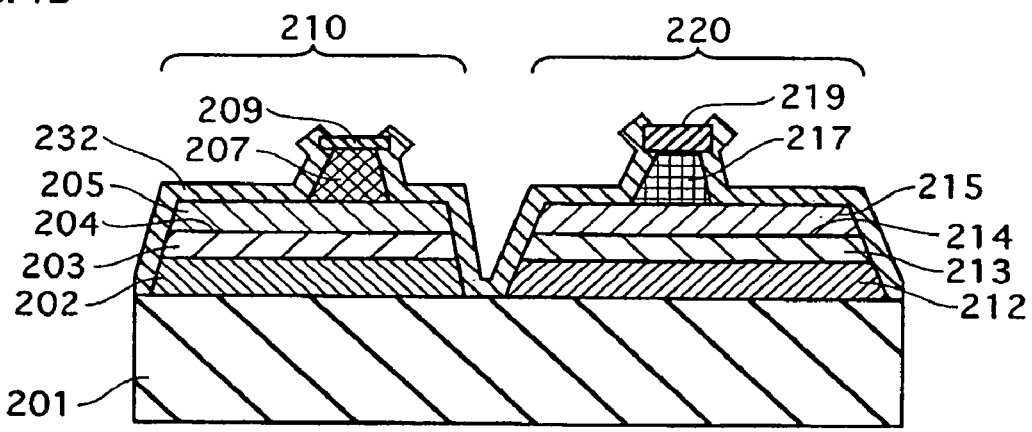
Figure 4C:
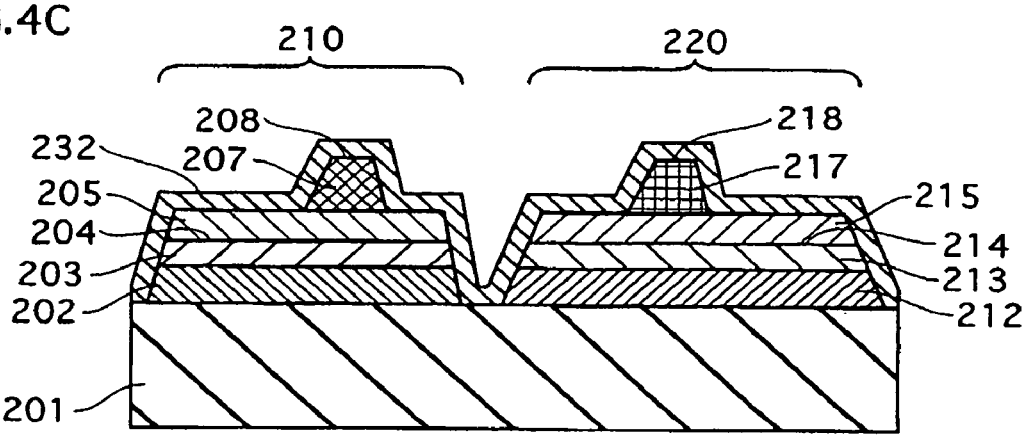

FIG. 4B is a sectional view taken along the line A-A' of FIG. 4A and shows a cross section of the laser gain regions. FIG. 4C is a sectional view taking along the line B-B' of FIG. 4A and shows a cross section of the window structures.

As illustrated in FIG. 4C, the contact layers 209 and 219 have been removed at regions of the window structures 231. The current blocking layer 232 covers the upper surface regions of the ridges exposed as a result of the contact layer removal. With this arrangement, no current is injected to the regions of the window structure 231 at the time of driving the laser elements. Thus, deterioration due to heat generated at the resonator facets in response to the injected current is suppressed, which leads to ensure the driving reliability.

For appropriately preventing current injection to the regions of the window structures 231, the contact layers 209 and 219 need to be removed at least 5 μm beyond the region of each window structure 231 in a direction toward the respective gain region, and the current blocking layer 232 needs to cover the upper surface regions of the ridges exposed as a result of the contact layer removal. Yet, if the contact layers are removed too excessively, there will be undesirable possibilities of property fluctuations due to increase in the resistance. For example, the threshold of current-light output properties of the laser elements may fluctuate. In order to suppress the fluctuations, it is desirable to keep each removal region within 80 μm from the laser facet.

Finally, a p-electrode (not illustrated) is formed on the surface of the topmost layer laminated on the n-type substrate 201 and an n-electrode (not illustrated) is formed on a rear surface of the substrate 201.

As has been described above, according to the embodiment, the GaAs contact layers of the respective laser elements are made to differ from each other in thickness for the purpose of controlling Zn diffusion carried out for forming window structures. Consequently, the active layers of the respective laser elements are uniformly disordered under the same annealing condition to achieve uniform compositions.

In addition, since Zn diffusion of both the laser elements are carried out all at once under the same annealing condition, the number of manufacturing steps can be reduced. In addition, the reliability of the device improves. More specifically, when window structures of each laser element are formed through a plurality of thermal treatments under different conditions, the laser elements are destined to experience unnecessary thermal histories, which is likely to reduce the reliability of the laser elements. Yet, according to the embodiment, Zn diffusion is carried out under the same condition, so that neither of the laser elements experiences unnecessary thermal history. As a consequence, the manufacturing yield and reliability of the laser devices improve.

Note that it is preferable to wet clean the surfaces of GaAs contact layers 209 and 219 in order to reduce the contact resistance with the electrodes and to suppress the interface state. In view of this, it is preferable that each of the contact layers 209 and 219 measures at least 0.05 μm in thickness. That is to say, it is preferable that the p-type GaAs contact layer 209 of the infrared laser element 210 measures at lest 0.05 μm in thickness.

In addition, the difference in film thickness (thickness difference) between the contact layer 209 of the infrared laser element 210 and the contact layer 219 of the red laser element 220 is determined based on the difference between the active layers 204 and 214 in the Zn diffusion coefficients (the coefficient describing the rate of Zn diffusion into the respective active layers). In the case where the difference between the Zn diffusion coefficients is large, the thickness difference is set to large accordingly.

Each Zn diffusion coefficient depends on the carrier densities of the GaAs contact layer and of the p-type cladding layer. Considering the difference between the diffusion coefficients of the infrared and red laser elements 210 and 220 of the embodiment, the thickness difference needs to be at least 0.01 μm, and preferably at least 0.05 μm.

In addition, it is also impotent to appropriately set the carrier density of each contact layer for the purpose of reducing the contact resistance between the contact layer and the electrode.

Simply speaking, in order to reduce the contact resistance between the contact layer and the electrode to an order of $10^{-5}$ $\Omega \cdot cm^2$, the carrier density of the contact layer needs to be $1 \times 10^{18}$ $cm^{-3}$ or higher.

Actually, however, the resistance of the laser element is determined not only by the contact resistance of the contact layer but also the width of the ridge. Taking this into consideration, in order to keep the contact resistance within $5\Omega$, the carrier density needs to be $5 \times 10^{17}$ $cm^{-3}$ or higher.

In the embodiment, the carrier densities of the p-type GaAs contact layers 209 and 219 are both set to $1 \times 10^{19}$ $cm^{-3}$.

Regarding the upper limit of the carrier densities, the doping concentration may be high within a range where doping during crystal growth is possible and no influence is imposed on Zn diffusion to the active layer. In the embodiment, Zu is used as the dopant.

In addition, as described above, disordering of the active layers by Zn diffusion may be controlled to some extent by making a difference in carrier density between the GaAs contact layer 209 of the infrared laser and the GaAs contact layer 219 of the red laser element.

Consequently, by making the difference between the contact layers 209 and 219 in carrier density in addition to the thickness difference, the Zn diffusion is suitably adjusted with a smaller thickness difference.

With this method, the thickness difference between the two contact layers may be kept relatively small, even when the two laser elements differ in the structure of the respective active layers or the thickness and/or composition of the respective cladding layers.

By keeping the thickness difference to a minimum, various advantages are achieved. For example, when mounting the monolithic semiconductor laser device onto e.g. a submount, the light emitting points of the laser elements may be made to parallel to the reference plane as much as possible. As a result, there is no restriction imposed on the design of an optical system employing the laser device.

Specifically, for example, by increasing the carrier density from $1 \times 10^{19}$ $cm^{-3}$ to $3 \times 10^{19}$ $cm^{-3}$ or so, the p-type GaAs contact layer 209 of the infrared laser with the thickness increased by 30% or more still exhibits the same level of Zn diffusion rate. Accordingly, the thickness difference with the contact layer 219 of the red laser is reduced.

In the embodiment, GaAs is used as the p-type contact layers of the infrared and red laser elements. Alternatively, however, $Al_xGa_{1-x}As$ ($0 < x \leq 0.4$) may be used as the contact layers.

By the presence of Al in each contact layer, diffusion of Zn into the active layer is facilitated, especially in the infrared laser. Yet, the presence of Al makes the surface of the contact layer more susceptible to oxidation and thus increases the contact resistance resulting from the interface state. In view of this, it is desirable to keep the Al content x to 0.4 or lower.

In addition, according to the embodiment, the compositions of cladding layers of the infrared and red laser elements are identical. Yet, the compositions of the respective cladding layers may be made to differ in the contents of Al, Ga, and In. In such a case, it is necessary to additionally consider the composition difference of the cladding layers, in adjusting the difference between the contact layers in thickness and/or carrier density.

According to the embodiment, each cladding layer is made of an AlGaInP-based material. Yet, a GaAs-based material may be used for the cladding layers. In addition, the current blocking layer may be made of a semiconductor layer such as AlInP.

According to the embodiment, a window structure is formed by diffusing Zn. Yet, any other impurities other than Zn may be used, and Si is one example.

Embodiment 2

Figure 6A:
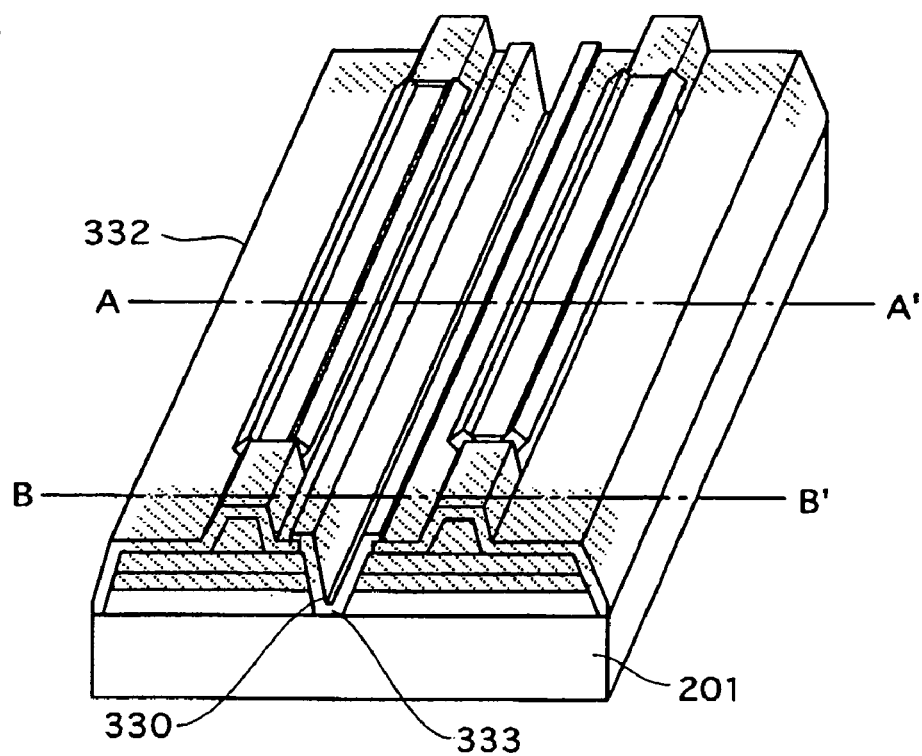
FIG. 6A is an oblique view and FIGS. 6B and 6C are sectional views of the semiconductor laser device according to the embodiment 2.
Figure 6B:
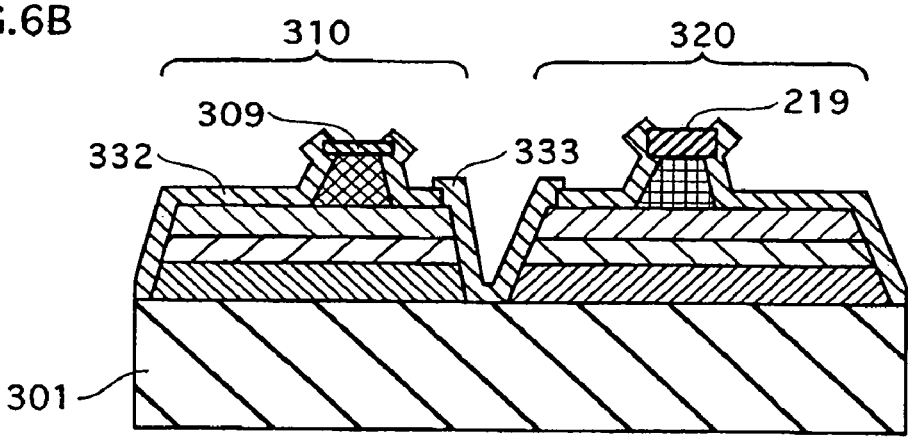
Figure 6C:
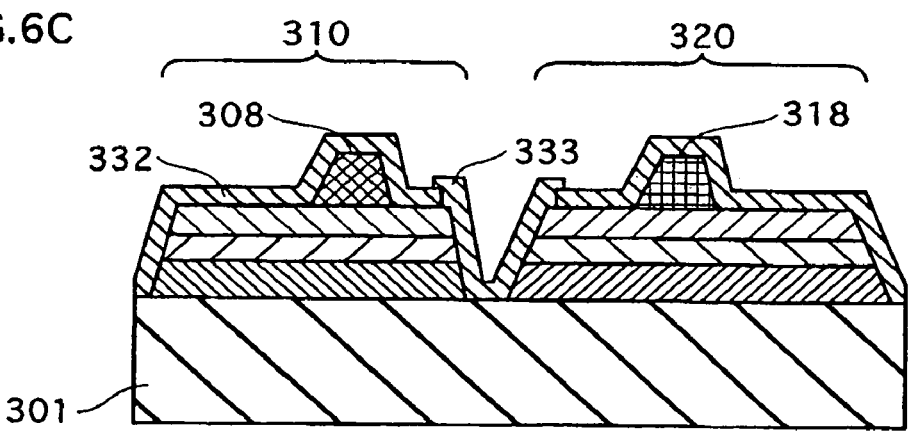
Figure 7C:
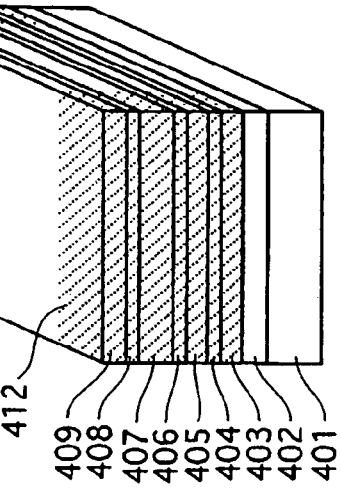
FIGS. 7A-7C are views illustrating a manufacturing method of a red laser device having facet window structures, according to a prior art technique.
Figure 7A:
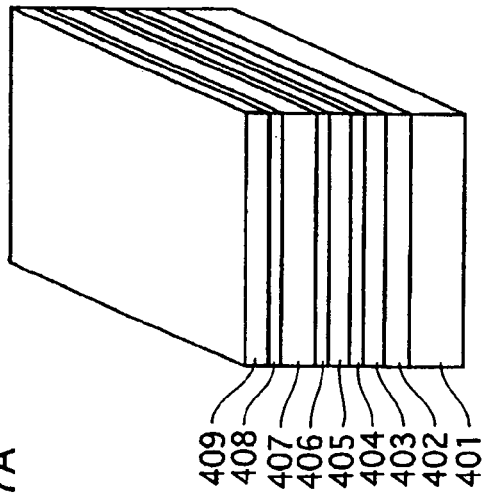
Figure 7B:
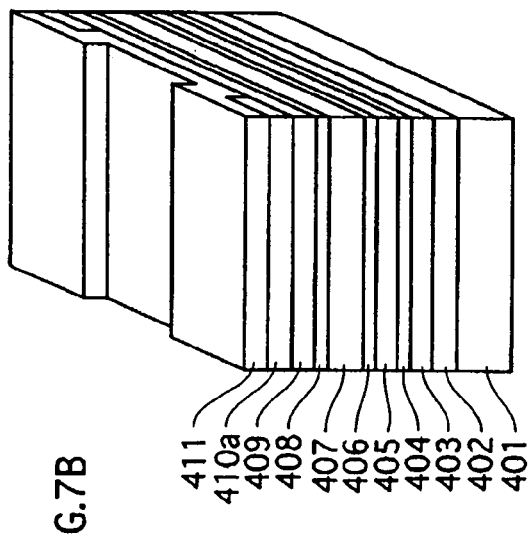

FIG. 6A is an oblique view of a semiconductor laser device according to an embodiment 2 of the present invention. FIGS. 6B and 6C are sectional views of the semiconductor laser device.

The semiconductor laser device of the embodiment 2 is basically similar in construction to the semiconductor laser device of the embodiment 1. The difference lies in that the current blocking layer is made of AlInP. In addition the manufacturing method differs from that of the embodiment 1. The following describes the second manufacturing method with reference to FIGS. 5 and 6.

Through the same steps illustrated in FIGS. 2A-3B of the embodiment 1, the ridges constituting part of the waveguides are formed.

Next, as illustrated in FIG. 5A, the $SiO_2$ film (not illustrated) and contact layers 309 and 319 are etched using photolithography to remove regions thereof existing above window structures 331.

Next, as illustrated in FIG. 5B, AlInP is selectively grown to form a current blocking layer 332, without removing the $SiO_2$ mask patterns present on the contact layers 309 and 319. The $SiO_2$ mask patterns have been used to form the ridges. This current blocking layer 332 made of AlInP prevents, at the time of driving, injection of current to the window structure regions formed at the facets.

Next, using photolithography and wet etching techniques, the current blocking layer 332 is etched to remove a region thereof grown on a separation groove 330. With the use of hydrochloric acid as the etchant, the AlInP current blocking layer 332 is selectively removed, while leaving a GaAs substrate 301 and IGaInP cladding layers 307 and 317.

Next, as illustrated in FIG. 6A, an insulating material is deposited, and then patterned using photolithography and wet etching techniques to leave an insulating film 333 on the surfaces of the separation groove 330.

As a result of the above-described etching of the AlInP current blocking layer 332 from the surfaces of the separation groove 330, a corresponding region of the GaAs substrate 301 comes to be exposed. Assembling the semiconductor laser device with the substrate partly exposed may give a rise to undesirable possibilities. For example, a chip bonding material such as solder may be accidentally applied to the groove. As a result, a short-circuit may be caused between the infrared laser element 310 and the red laser element 320. Yet, the inner surface of the separation groove 330 is coated with the insulating film 333 as described above. Thus, occurrence of short-circuits at the time of assembling is suppressed.

Finally, a p-electrode (not illustrated) is formed on the surface of the topmost layer laminated on the n-type substrate 301 and an n-electrode (not illustrated) is formed on a rear surface of the substrate 301.

The embodiment 2 achieves the same advantages as described with respect to the embodiment 1. In addition, occurrence of short-circuit between the laser elements at the time of assembling is prevented. In addition, the current blocking layer is made with a semiconductor layer of AlInP, which does not absorb light emitted by the respective laser elements. This is advantageous in view of high light output. In addition, the current blocking layer made of AlInP has higher thermal conductivity and thus has better thermal dissipation than a dielectric layer such as $SiO_2$. This is also advantageous in view of high light output. In addition, with the current blocking layer made of AlInP, the difference among the refractive indices of the semiconductor layers constituting individual laser elements is made smaller as compared with the case where a dielectric layer such as $SiO_2$ is used. This is also advantageous in view of high light output.

Although the current blocking layer according to the embodiment 2 is made of AnInP, it is applicable to use AlGaInP having a high Al content. Such a current blocking layer has a similar advantage of not absorbing light emitted by the respective laser elements.

As has been described above, according to the present invention, a semiconductor laser device has an infrared laser element and a red laser element monolithically assembled, and disordering of respective active layers to form a window structure at each facet is appropriately achieved by subjecting both the infrared and red laser elements to one and the same thermal treatment. Since the window structures of both the laser elements are formed all at once by one thermal treatment, the number of processing steps is reduced and neither of the laser elements is subjected to an excessive thermal treatment. Thus, the resulting laser device ensures high light output and high reliability. Such a laser device is suitable especially to an optical disc recording device and the like.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A monolithic semiconductor laser device comprising:
   a first semiconductor laser element and a second semiconductor laser element disposed on a single substrate, the first semiconductor laser element being operable to emit light at a first wavelength, and the second semiconductor laser element being operable to emit light at a second wavelength,
   wherein each of the first and second semiconductor laser elements includes a double-hetero structure composed of a cladding layer of a first conductivity type, an active layer, a cladding layer of a second conductivity type, and a contact layer laminated in the stated order, and
   a material of the active layer of the first semiconductor laser element is smaller in impurity diffusion coefficient than a material of the active layer of the second semiconductor laser element, and
   the contact layer of the first semiconductor laser element is thinner than the contact layer of the second semiconductor laser element.

2. The monolithic semiconductor laser device according to claim 1,
   wherein each of the first and second semiconductor laser elements has a window structure region formed at either or both facets of a resonator by introduction of impurities.

3. The monolithic semiconductor laser device according to claim 1,
   wherein each of the first and second semiconductor laser elements includes a waveguide having a ridge.

4. The monolithic semiconductor laser device according to claim 3,
   wherein the first and second semiconductor laser elements include a current blocking layer covering lateral surfaces of the ridge of each waveguide.

5. The monolithic semiconductor laser device according to claim 1,
   wherein the first and second semiconductor laser elements mutually differ in thickness of the respective contact layers at least by 0.01 μm.

6. The monolithic semiconductor laser device according to claim 5,
   wherein the contact layer of each of the first and second semiconductor laser elements is at least 0.05 μm in thickness.

7. The monolithic semiconductor laser device according to claim 1,
   wherein the first wavelength is in an infrared waveband of 780 nm and the second wavelength is in a red waveband of 660 nm.

8. The monolithic semiconductor laser device according to claim 1,
   wherein the contact layer of each of the first and second semiconductor laser elements is made of $Al_xGa_{1-x}As$, where $0 \leq x \leq 0.4$.

9. The monolithic semiconductor laser device according to claim 1,
   wherein the contact layer of each of the first and second semiconductor laser elements has a carrier density of $5 \times 10^{17}$ $cm^{-3}$ or higher.

10. The monolithic semiconductor laser device according to claim 4,
    wherein the current blocking layer covers of the upper surface of the ridge of each waveguide at least at a region corresponding to where a window structure is formed.

11. The monolithic semiconductor laser device according to claim 1,
    wherein the first and the second semiconductor laser elements are separated by a separation groove of which inner surface is coated with an insulating film.

12. The monolithic semiconductor laser device according to claim 9,
    wherein the carrier density of the contact layer of the first semiconductor laser element is at least 1.5 times the carrier density of the contact layer of the second semiconductor laser element.

* * * * *